(12) United States Patent
Ishibashi et al.

(10) Patent No.: US 6,815,748 B2
(45) Date of Patent: Nov. 9, 2004

(54) SEMICONDUCTOR INTEGRATED CIRCUIT DEVICE WITH CONNECTIONS FORMED USING A CONDUCTOR EMBEDDED IN A CONTACT HOLE

(75) Inventors: Koichiro Ishibashi, Warabi (JP); Shuji Ikeda, Koganei (JP); Harumi Wakimoto, Hachioji (JP); Kenichi Kuroda, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/761,311

(22) Filed: Jan. 22, 2004

(65) Prior Publication Data

US 2004/0150053 A1 Aug. 5, 2004

Related U.S. Application Data

(62) Division of application No. 10/303,024, filed on Nov. 25, 2002, now Pat. No. 6,703,667, which is a division of application No. 09/436,500, filed on Nov. 9, 1999, now abandoned.

(30) Foreign Application Priority Data

Nov. 10, 1998 (JP) .......................................... 10-318694

(51) Int. Cl.$^7$ ...................... H01L 27/108; H01L 29/76; H01L 29/94; H01L 31/119
(52) U.S. Cl. ...................................... 257/296; 257/306

(58) Field of Search ................................. 257/295–310; 438/253–254

(56) References Cited

U.S. PATENT DOCUMENTS

| | | |
|---|---|---|
| 5,278,436 A | 1/1994 | Asahina et al. |
| 5,541,434 A | 7/1996 | Nicholls et al. |
| 5,654,572 A | 8/1997 | Kawase |
| 5,767,546 A | 6/1998 | Williams et al. |
| 2001/0019145 A1 * | 9/2001 | Yamanaka et al. .......... 257/296 |

FOREIGN PATENT DOCUMENTS

JP 10-154756 9/1998

* cited by examiner

*Primary Examiner*—Cuong Nguyen
(74) *Attorney, Agent, or Firm*—Mattingly, Stanger & Malur, P.C.

(57) ABSTRACT

The metal layers embedded into the contact holes of various kinds in shape are used as the lines and are employed as the lines for controlling the substrate bias. The first-layer metal line layers are made thin so as to be also employed as the lines for controlling the substrate bias. Moreover, the second-layer metal line layers are employed as the copper line layers. Thereby, a semiconductor integrated circuit which allows a high-speed and low-power operation is provided with a small area and without increasing the number of the masks.

15 Claims, 14 Drawing Sheets

SEMICONDUCTOR INTEGRATED CIRCUIT DEVICE WITH CONNECTIONS FORMED USING A CONDUCTOR EMBEDDED IN A CONTACT HOLE

This is a divisional application of U.S. Ser. No. 10/303,024, filed Nov. 25, 2002 now U.S. Pat. No. 6,703,667, which is a divisional application of U.S. Ser. No. 09/436,500, filed Nov. 9, 1999, now abandoned. This application is related to U.S. Ser. No. 10/442,156, filed May 21, 2003.

BACKGROUND OF THE INVENTION

1. Field of the Invention

The present invention relates to a semiconductor conductor integrated circuit. More particularly, it is suitable for a CMOS semiconductor integrated circuit suited to implement a high-speed operation with a low electric power. In particular, it relates to a semiconductor integrated circuit which can be implemented with a small area and without increasing the number of photomasks.

2. Description of the Prior Art

Conventionally, in order to implement the high-speed operation with the low electric power, there has been proposed the following method. Electric potentials of substrates of NMOS and PMOS (i.e. P-well and N-well) in a CMOS integrated circuit are controlled at the time of operation or standby, and thus the threshold values are set to be the optimum values for the low voltage operation. For example, in Digest of Technical Papers, 1996 IEEE International Solid-State Circuits Conference, pp.166–167, the following method has been presented. P-well and N-well electrodes are put far from transistors made in the respective wells.

SUMMARY OF THE INVENTION

The higher the transistor is operated, the larger the substrate current generated from the transistor during the operation becomes. Accordingly, except when the integrated circuit is operated at a lower speed anyway, at the time of the high-speed operation, the well potential at transistor position differs from the well potential at electrode position. This makes it impossible to obtain an optimum value for the well potential.

Assuming that the substrate current from each transistor is equal to 1 $\mu$A and 1000 units of transistors are operated simultaneously, the summation of the substrate currents becomes equal to 1 mA. Thus, if a resistance of each well is assumed to be 1 K$\Omega$, the resultant potential drop becomes equal to 1V. In spite of the fact that, judging from the present actual circumstance of the integrated circuit, these values are really ordinary and commonplace numerals, they bring about the potential variation of 1V. This potential variation gives rise to a variation of about 0.1 V to 0.3 V in the threshold voltage. Namely, there occurs the difference of such magnitude in the threshold value between the transistor in the proximity of the extracted electrode position and the transistor at the considerable distance therefrom. This condition causes the difference in the characteristics between both of the transistors, making it absolutely and utterly impossible to implement the high-speed operation.

Meanwhile, there has been known a method in which a line for providing a well potential is wired together with a power line and a ground line. In this case, the line permits the well potential to be extracted firmly and securely, thereby making the well potential remain constant regardless of the position. At this time, however, the layout of the both lines must be performed on an identical plane, which has necessitated a wide area.

Also, JP-A-10-154756 discloses a method in which a well potential line is wired with a diffusion layer and a power line is wired with a metal line layer. Unfortunately, the diffusion layer has a sheet resistance of about 10$\Omega$ even when a silicide is employed. This condition has increased a resistance of the line itself, placing a certain restriction onto the effect.

A problem that the present invention aims at solving is to implement a CMOS integrated circuit, which is allowed to operate at a high-speed with a low electric power by controlling a substrate bias, with a small area and without using extra photomasks.

In order to solve the above-described problem, in the present invention, a metal embedded in a contact hole is used as a line. For this purpose, contact holes having various types of configurations are formed. For example, a contact hole having a long and slim configuration is formed so as to electrically connect objects positioned away from each other. Even if a first metal line layer is made thinner or a metal such as tungsten with a comparatively high resistance is employed, the metal embedded in the contact hole is used as needed, thereby lowering and compensating for the high resistance resulting from the employment of the first metal line layer or tungsten. This compensation makes it possible to prevent the characteristic deterioration in the integrated circuit without increasing the number of the photomasks.

Moreover, the first metal line layer or the above-described metal embedded in the contact hole is used as the line for the well potential. Then, a second metal line layer is used as the line for the power supply or the ground potential, and the line for the power supply or the ground potential is wired in such a manner as to cover the metal line layer for the well potential. This makes it possible to form, while preventing increase in an area of the cell, a CMOS integrated circuit the substrate potential of which can be controlled. Also, at this time, a low resistance metal such as copper is used as the second metal line layer. This lowers a resistance of the power supply even further, resulting in an effect of enhancing the performance.

Also, the use of the above-described configuration of the lines makes the following possible. When DRAM cells are placed on the same chip, a bit line of the DRAM having a thin film thickness and a high resistance is made identical to the first metal line layer in the CMOS circuit. This condition permits the performances of the DRAM and CMOS circuit to be enhanced without increasing the number of the photomasks.

Explaining another aspect of the present invention, an integrated circuit device comprises: a MIS transistor formed in a substrate; a first line layer formed on the substrate; a second line layer formed on the first line layer; and a contact hole for electrically connecting two of a source, gate and drain of the MIS transistor, the first line layer and the second line layer, wherein when an X-Y plane is assumed on a surface of the substrate, configuration of projection onto the X-Y plane of the source, gate and drain of the MIS transistor, the first line layer or the second line layer which are connected by the contact hole has a non-overlapped portion.

Also, in another aspect, an integrated circuit device comprises: a MIS transistor formed in a substrate; a first line layer formed on the substrate; a second line layer formed on the first line layer; and a contact hole for electrically connecting two of a source, gate and drain of the MIS transistor, the first line layer and the second line layer, wherein when an X-Y plane is assumed on a surface of the substrate, configuration of projection onto the X-Y plane of contact portions at which said two of the source, gate and drain of the MIS transistor, the first line layer and the second line layer are connected by the contact hole has a non-overlapped portion.

Various types of conductors are embedded into the contact holes, thereby allowing the resistance to be adjusted. The first and second line layers are formed as metal line layers, thereby allowing the resistances to be lowered.

Also, an integrated circuit device comprises: a diffusion layer formed in a substrate; an intermediate layer formed on the substrate; a line layer formed on the intermediate layer; and a contact hole formed in the intermediate layer for electrically connecting the diffusion layer to the line layer, wherein when an X-Y plane is assumed on a surface of the substrate, configuration of projection onto the X-Y plane of a contact portion of the diffusion layer and the contact hole and configuration of projection onto the X-Y plane of a contact portion of the line layer and the contact hole have non-overlapped portions.

Also, an integrated circuit device comprises: a first line layer formed on a substrate; an intermediate layer formed on the first line layer; a second line layer formed on the intermediate layer; and a contact hole formed in the intermediate layer for electrically connecting the first line layer to the second line layer, wherein when an X-Y plane is assumed on a surface of the substrate, configuration of projection onto the X-Y plane of a contact portion of the first line layer and the contact hole and configuration of projection onto the X-Y plane of a contact portion of the second line layer and the contact hole have non-overlapped portions.

Also, in another aspect, an integrated circuit device comprises: a MIS transistor formed in a substrate; a first metal line layer formed on the substrate; and a second metal line layer formed on the first metal line layer, wherein at least a part of a power line connected to a source/drain channel in the MIS transistor is constituted by the second metal line layer; at least a part of a well potential line for controlling a well potential of the MIS transistor is constituted by the first metal line layer; and at least a part of the power line overlaps with at least a part of the well potential line.

Also, making the power line overlap with the well potential line completely allows an area of the element to be reduced. It is required to cause a comparatively large electric power to flow through the power line. For this reason, it is desirable that the width of the power line should be greater than that of the well potential line. For the reason similar to this, it is desirable that the first metal line layer should be composed of a metal the main constituent of which is tungsten and the second metal line layer should be composed of a metal the main constituent of which is copper with a low resistance. Also, the first metal line layer may be configured to be thinner than the second metal line layer. Also, a contact hole is formed in an intermediate layer between the substrate and the first metal line layer in such a manner that the contact hole overlaps with the first metal line which constitutes a part of the well potential line. As the result, the contact hole as well constitutes a part of the well potential line, which makes it possible to lower a resistance of the well potential line. At this time, making the first metal line overlay the contact hole allows the area of the element to be reduced.

Also, in another aspect, an integrated circuit device comprises: a MIS transistor formed in a substrate; a first metal line layer formed on the substrate; an intermediate layer between the substrate and the first metal line layer; and a second metal line layer formed on the first metal line layer, wherein at least a part of a power line connected to a source/drain channel in the MIS transistor is constituted by the second metal line layer; at least a part of a well potential line for controlling a well potential of the MIS transistor is constituted by a conductor which is formed within a contact hole formed in the intermediate layer; and the power line overlaps with the contact hole. At this time, the width of the power line can be made greater than that of the contact hole.

Also, in another aspect, an integrated circuit device comprises: a MIS transistor formed in a substrate; a first metal line layer formed on the substrate; and a second metal line layer formed on the first metal line layer, wherein at least a part of a power line connected to a source/drain channel in the MIS transistor is constituted by the second metal line layer; at least a part of a well potential line for controlling a well potential of the MIS transistor is constituted by the first metal line layer; the first metal line layer is formed of tungsten as a main constituent; and the second metal line layer is formed of copper as a main constituent.

In another aspect, an integrated circuit device comprises: a MIS transistor formed in a substrate; a memory cell for storing data; a first metal line layer formed on the substrate; and a second metal line layer formed on the first metal line layer, wherein at least a part of a power line connected to a source/drain channel in the MIS transistor is constituted by the second metal line layer, at least a part of a well potential line for controlling a well potential of the MIS transistor is constituted by the first metal line layer; and at least a part of a bit line for transmitting an input/output data signal to/from the memory cell is constituted by the first metal line layer.

Also, when forming an integrated circuit device in which a memory and a logical circuit are mixed, it is desirable that the integrated circuit device comprises: a MIS transistor formed in a substrate; a memory cell for storing data; a first line layer a main constituent of which is tungsten; and a second metal line layer a main constituent of which is copper, wherein at least a part of a power line connected to a source/drain channel in the MIS transistor is constituted by the second metal line layer; at least a part of a well potential line for controlling a well potential of the MIS transistor is constituted by the first metal line layer; and at least a part of a bit line for transmitting an input/output data signal to/from the memory cell is constituted by the first metal line layer.

As another aspect in this case, an integrated circuit device comprises: a MIS transistor formed in a substrate; a memory cell for storing data; a first metal line layer which is formed on the substrate and a main constituent of which is tungsten; and a second metal line layer which is formed on the first metal line layer and a main constituent of which is copper, wherein at least a part of a power line connected to a source/drain channel in the MIS transistor is constituted by the second metal line layer; and at least a part of a bit line for transmitting an input/output data signal to/from the memory cell is constituted by the first metal line layer.

Here, at least the part of the well potential line for controlling the well potential of the MIS transistor may be constituted by the first metal line layer. Also, in a preferred concrete embodiment, the memory cell is a DRAM cell. Thus, a capacitor in the DRAM cell is located between the first metal line layer and the second metal line layer. More concretely, a gate electrode layer is located between the substrate and the first metal line layer.

Also, as a modification example, an integrated circuit device comprises a contact hole for selecting two of a substrate, a first metal line layer, a second metal line layer and a gate electrode layer as a first connection object and a second connection object so as to connect the first connection object to the second connection object, wherein when an X-Y plane is assumed on a surface of the substrate, projection onto the X-Y plane of a contact surface of the first connection object and the contact hole has a portion at which said projection does not overlap with a mapping onto the X-Y plane of a contact surface of the second connection object and the contact hole.

The foregoing and other objects, advantages, manner of operation and novel features of the present invention will be understood from the following detailed description when read in connection with the accompanying drawings.

DESCRIPTION OF THE PREFERRED EMBODIMENTS

Figure 1A:
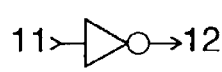
FIGS. 1A–1D are configuration diagrams of a first embodiment in the present invention.
Figure 1B:
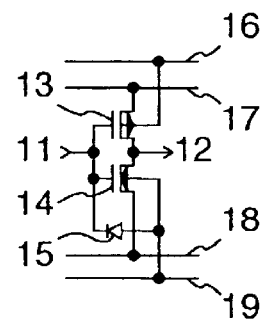

Referring to the accompanying drawings, the explanation will be given below concerning embodiments of the present invention.

FIGS. 1A–1D illustrate a first embodiment of the present invention. FIGS. 1A–1D are a logic diagram of an inverter circuit which is a basic circuit of a CMOS, a circuit diagram thereof, a layout diagram thereof and a cross sectional view thereof, respectively. In the logic diagram shown in FIG. 1A, reference numerals 11 and 12 denote an input terminal and an output terminal, respectively. In the circuit diagram shown in FIG. 1B, reference numeral 13 denotes a PMOS transistor, 14 an NMOS transistor, 15 a diode, 16 a line for a substrate of the PMOS transistor, 17 a power line, 19 a line for a substrate of the NMOS transistor, and 18 a ground line.

As illustrated in FIGS. 1A–1D, the present embodiment relates to the following CMOS integrated circuit. The electric potentials of the substrates of the transistors are connected through the lines 16 and 19. The electric potentials of the lines are controlled so as to set the threshold voltages of the MOS transistors to be the desired values, thereby making it possible to implement the low-power and high-speed operation. Also, the diode 15 is inserted in order to prevent a phenomenon that, in an integrated circuit fabricating process such as etching, the gate electrodes of the MOS transistors 13 and 14 are charged and thus the oxide films are broken down.

Figure 1C:
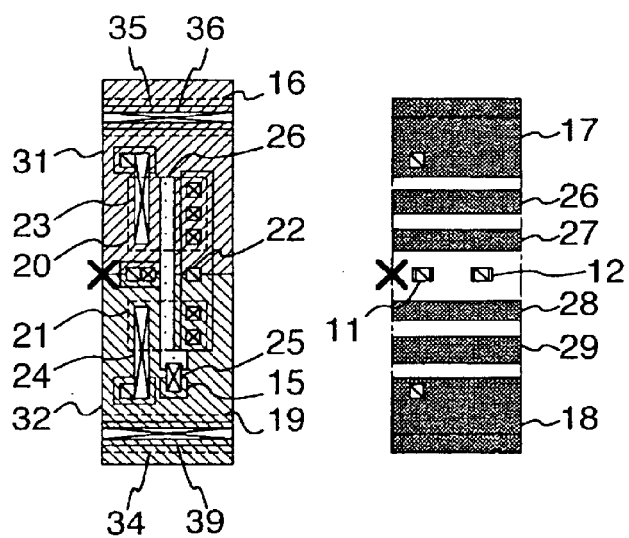

In the layout diagram shown in FIG. 1C, a diagram on the left illustrates a diffusion layer, a gate layer, a contact layer and a line layer as the first layer. A diagram on the right illustrates a through hole and a diffusion layer as the second layer. Reference notation X indicates the point of origin.

In FIGS. 1A–1D, reference numeral 26 denotes the gate electrode which is common to the NMOS transistor and the PMOS transistor. Reference numeral 31 denotes an N-well, and reference numeral 20 therein denotes a P-type diffusion layer for forming the PMOS transistor. Reference numeral 35 denotes an N-type diffusion layer for providing a potential of an N-well. The potential of the N-type diffusion layer is wired by the first-layer metal line 16 through a transversely long contact hole 36. Furthermore, a source electrode of the PMOS transistor is connected finally to the power line 17 formed of the second-layer metal line, through a longitudinally long contact hole 23.

Meanwhile, reference numeral 32 denotes a P-well, and reference numeral 21 therein denotes an N-type diffusion layer for forming the NMOS transistor. Reference numeral 34 denotes a P-type diffusion layer for providing a potential of the P-well. A potential of the P-type diffusion layer is wired by a first-layer metal line 19 through a transversely long contact hole 39. Furthermore, a source electrode of the NMOS transistor is connected finally to a second-layer metal line 18 through a longitudinally long contact hole 24.

Figure 1D:
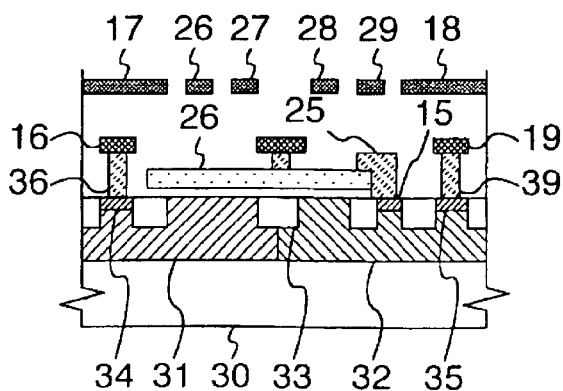

FIG. 1D illustrates the cross sectional view obtained by cutting a central portion in FIG. 1C in a longitudinal direction. Reference numeral 30 denotes a semiconductor substrate, 31 the N-well, 32 the P-well, and 33 an element isolating region. The other reference numerals are the same as those in the layout diagram shown in FIG. 1C.

As illustrated in FIGS. 1A–1D, in the present invention, the lines 16 and 19 for providing the well potentials are wired on the diffusion layers 35 and 34. Accordingly, no extra area is needed for wiring these lines. In addition, the power line 17 and the ground line 18 are formed of the second-layer metal line layer and are located in such a manner as to overlay the lines 16 and 19.

In the case of a CMOS integrated circuit which controls no well potentials, the power line and the N-well are at the same electric potential as the ground line and the P-well. Consequently, wiring a single line has sufficed for both of the above-described groups. In the case of controlling the well potentials, however, it is required to make the well potentials different from each other. Thus, wiring the single and same line necessitates an extra region. In the present invention, using the two metal layers, the resultant lines corresponding to the different well potentials are located in being overlaid to each other. Accordingly, there is no need of the extra region. This results in a technical effect of being capable of implementing, without increasing the area, the CMOS integrated circuit which is suited for the low-power and high-speed operation through the control of the well potentials. Also, instead of a signal line having a potential variation, the power line or the ground line the potential of which is fixed is wired on the line of the well potential. This brings about a technical effect of preventing the well potential variations caused by a coupling.

As illustrated in FIG. 1C, the second-layer metal line layer is used as extraction terminals of the input and output terminals 11 and 12, the power line 17, and the ground line 18. In addition to this, as indicated by reference numerals 26, 27, 28 and 29, it becomes possible to provide the lines in such a manner that they pass through in the transverse direction. In this case, there exists a technical effect of being capable of utilizing these lines as ones among the other logic gates on the same chip.

Also, in the present embodiment, the contact hole is not determined in size. Thus, for example, the longitudinally long or the transversely long contact hole is employed. In recent years, the depth of the contact hole has become increasingly deeper, and on account of this, a metal such as tungsten has been embedded into the contact hole. In the present embodiment, in view of the condition that a metal is embedded into the contact hole, the contact hole is made longitudinally or transversely long. This procedure permits the contact hole itself to be positively utilized just like a line, thereby aiming at enhancing the performance of the logic gate.

In general, in a CMOS integrated circuit, an increase in the source resistance in the transistor results in deterioration in the current driving capability of the transistor. In the present embodiment, as indicated by reference numerals 23 and 24, the longitudinally long contact holes are located on the side of the source of the transistor, and a metal is embedded therein. This procedure brings about a technical effect of making it possible to reduce the source resistance and to enhance the current driving capability of the transistor.

The transversely long contact holes 36 and 39 are located in such a manner that they overlay the lines 16 and 19 for the well potentials. This procedure results in a technical effect of making it possible to substantially reduce the line resistances of the lines 16 and 19 and to securely control the well potentials.

Also, it is possible to connect the gate to the diffusion layer by only the conductor 26 in the contact hole. At this time, even if the first-layer metal layer is not connected, it is possible to connect the gate to the diffusion layer.

Generally speaking, a gate insulating film in the MOS transistor is extremely thin. Accordingly, there are some cases where the gate insulating film undergoes an electrostatic breakdown during the fabricating process. This breakdown can be prevented by connecting a diode which includes a gate and a diffusion layer. In the present embodiment, the diode 15 is formed in a region of the P-well 32, and the diode 15 is connected to the gate electrode 26 by the metal layer 25 embedded in the longitudinally long contact hole 15. Moreover, the first-layer metal line layer is not connected to the contact hole 25. Providing the structure like this makes unnecessary the first-layer metal line layer for connecting the gate to the diode, thus making it possible to take advantage of the resultant space for the purpose of the other lines.

FIGS. 2A–2D are drawings for explaining a method of using a contact hole in the present invention. Here, FIGS. 2A–2D are cross sectional views of a prior art for comparison, a layout diagram thereof, a cross sectional view of the present invention, and a layout diagram thereof, respectively.

Figure 2A:
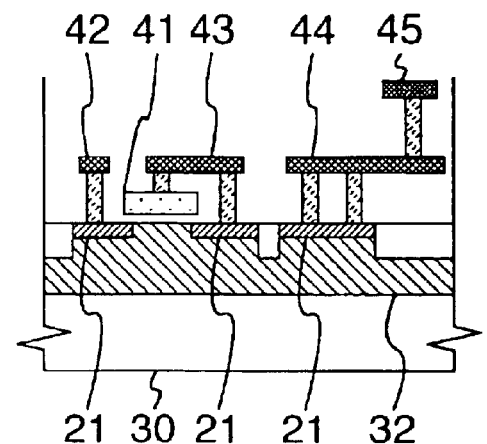
FIGS. 2A–2D are configuration diagrams for comparing the conventional invention with the present invention.
Figure 2B:
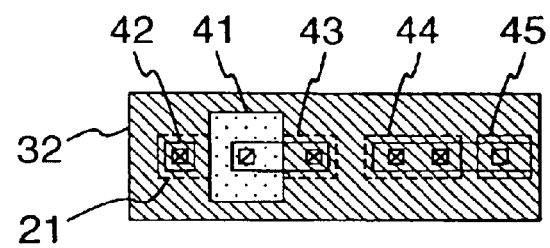
Figure 2C:
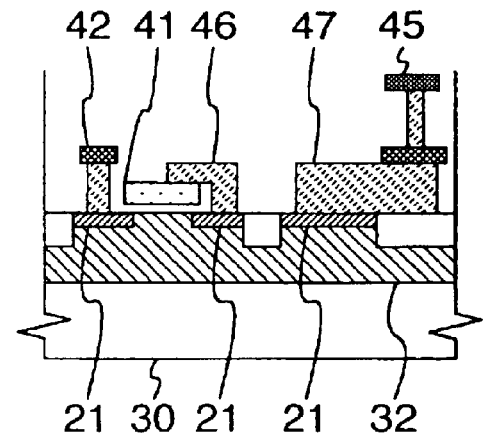
Figure 2D:
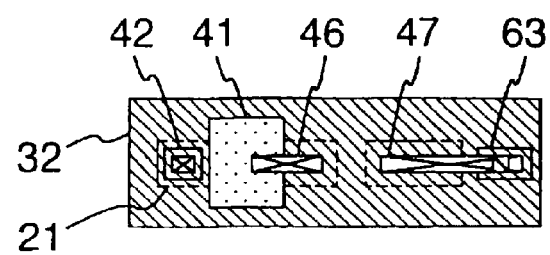

In the prior art illustrated in FIGS. 2A and 2B, when a gate electrode 41 is connected to a diffusion layer 21, for example, a first-layer line layer 43 is used through a contact hole. In contrast to this, in the present invention, the connection is performed using a conductor embedded in a contact hole 46. When the film thickness of the first-layer line layer is thin and the sheet resistance is high, this procedure makes it possible to connect the gate electrode to the diffusion layer without increasing the resistance.

In the present invention, when the diffusion layer 21 is connected to a second-layer line layer 45, the resistance can also be made lower. Namely, in the prior art, the diffusion layer 21 is connected to a first-layer line layer 44 through two contact holes, then being connected to the second-layer line layer 45 through a through hole. In this case as well, if the film thickness of the first-layer line layer is thin, the resistance is increased. In the present invention, however, a metal layer embedded in a contact hole 47 is utilized like a line layer, thereby connecting the diffusion layer 21 to the second-layer line layer 45. This procedure brings about a technical effect of substantially lowering the resistance of the diffusion layer 21, because the diffusion layer 21 is in contact with the thick metal layer embedded continuously in the contact hole. Also, the contact hole is caused to extend over to an upper portion of an insulating isolation layer, thereby making it possible to lower all the resistances that finally range from the resistance of the diffusion layer 21 to that of the second-layer line layer 45.

FIGS. 3A–3H are diagrams for illustrating a fabricating process in the present invention.

Figure 3A:
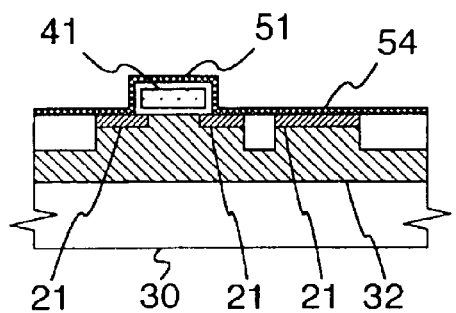
FIGS. 3A–3H are cross sectional views for illustrating a fabricating process in the present invention.
Figure 3B:
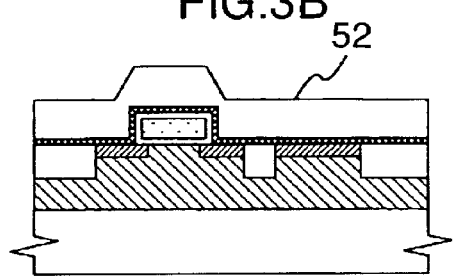
Figure 3C:
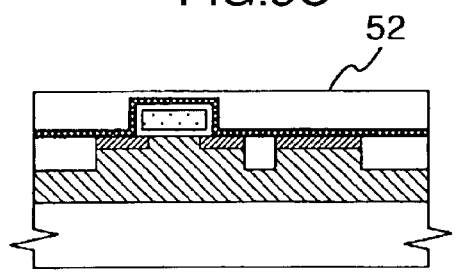
Figure 3D:
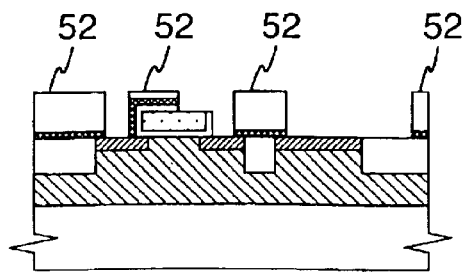
Figure 3E:
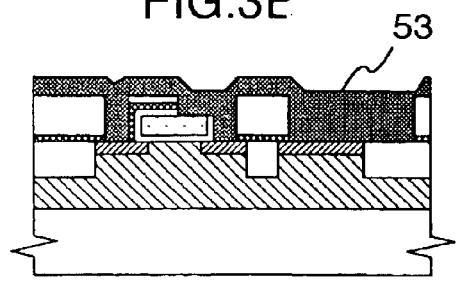
Figure 3F:
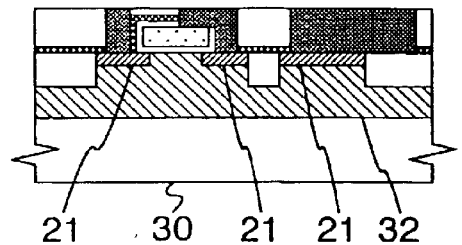
Figure 3G:
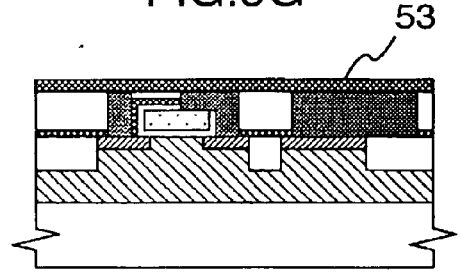
Figure 3H:
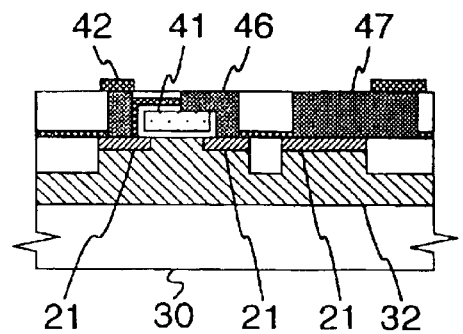

In FIG. 3A, a transistor is fabricated in a known fabricating process. Reference numeral 41 denotes a gate electrode of a transistor, 21 a diffusion layer, and 54 a silicon nitride used for selection etching. Then, in FIG. 3B, an insulating film 52 is formed. At this time, as a step difference due to the gate electrode exists on the underlying layer, it turns out that the portion of the step difference still remains projected after the insulating film 52 is formed. Thereby, in FIG. 3C, the projected portion is polished using a mechanical chemical polishing method (i.e., so-called CMP method) to be planarized. Next, in FIG. 3D, a contact hole is bored. At this time, the insulating film 52 is etched first by employing the silicon nitride 54 as an etching stopper. Then, the silicon nitride 54 is etched, thereby casing the silicon surface to be exposed. Next, in FIG. 3E, a metal such as tungsten is deposited using CVD method. The CVD method has a characteristic that causes the metal to be deposited along the surface of an object. Thus, concerning the inside of the contact hole as well, the metal is deposited along the sidewall of the contact hole. As the result, it turns out that the inside of the contact hole is completely filled with the metal.

Also, the present invention is characterized in that a long contact hole is employed. In this case as well, the width of the long contact hole is made equal to that of a contact hole which is usual in length, thereby also allowing the metal to be deposited along the sidewall of the long contact hole and eventually, permitting the inside thereof to be filled with the metal. Moreover, in FIG. 3F, an etchback method is used in which the deposited metal layer is etched from directly above the layer, thereby isolating the respective metals inside the contact hole and making it possible to implement the configuration in which the metal is embedded in the contact hole. Next, a first-layer metal layer 53 is deposited in FIG. 3G, and is then etched in FIG. 3H, thereby making it possible to implement the pattern of the first-layer metal layer.

Going through the above-described steps, by just the ordinary steps for forming the contact hole, it makes possible to obtain the various sizes of contact holes and to embed the metals therein. Then, the embedded metal is utilized like a line and is used for the connection within the integrated circuit. This procedure results in a technical effect of implementing the line with a low resistance.

Figure 4A:
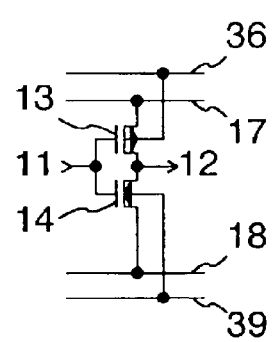
FIGS. 4A–4D are configuration diagrams of a second embodiment in the present invention.
Figure 4B:
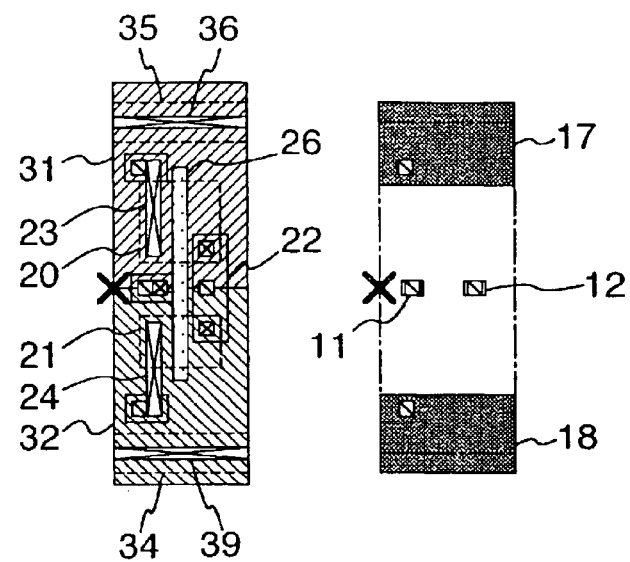
Figure 4C:
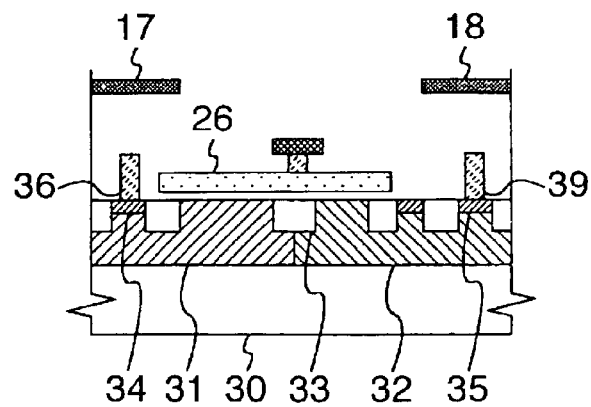
Figure 4D:
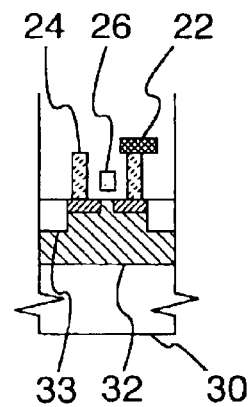

FIGS. 4A–4D illustrate a second embodiment of the present invention. There are presented a circuit diagram of an inverter circuit which is a basic circuit of a CMOS integrated circuit, a layout diagram thereof, and cross sectional views thereof. FIG. 4C is a cross sectional view obtained by cutting a central portion in the layout diagram in an Y direction. FIG. 4D is a cross sectional view obtained by cutting a portion of an NMOS transistor in the layout diagram in an X direction.

In the present embodiment, long and slim contact holes 24, 23, 39 and 36 establish the connections of a source side of a diffusion layer 21 in the NMOS transistor, a source side of a diffusion layer 20 in the PMOS transistor, a well electrode 39 of a P-well 32, and a well electrode 35 of an N-well 31, respectively. This makes it possible to lower the resistances of the respective portions. Lowering the resistance on the source side of the transistor brings about a technical effect of enhancing the current driving capability of the transistor. Also, lowering the resistances of the well electrode results in a technical effect of making it possible to stabilize the well potentials. Consequently, for example, the latchup-resistant property can be improved, and in addition to this, noise of the wells can be made smaller when the substrate bias is provided. This brings about a technical effect of preventing the substrate bias from being varied because of the noise.

Also, in the present embodiment, the ordinary contact holes and the first-layer metal line layer are used on the drain side. This is due to the fact that making the first-layer metal line layer thin makes it possible to reduce a parasitic capacitance on the drain side. Generally speaking, lowering the capacitance on the drain side leads to the enhancements in the speed and the power consumption level of the CMOS integrated circuit. In many cases, the resistance on the drain side exerts no influences and thus is of no importance. In view of these tendencies, on the source side, the metal embedded into the contact hole is used so as to reduce the resistance, and on the drain side, the minimum number of contact holes are used and the connection is established with the first-layer metal line layer so as to reduce the parasitic capacitance. This procedure makes it possible to provide the CMOS configuration which is the most suitable for enhancing the performance in the operation speed.

Figure 5A:
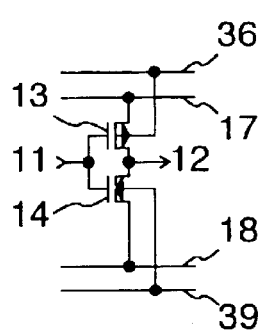
FIGS. 5A–5D are configuration diagrams of a third embodiment in the present invention.
Figure 5B:
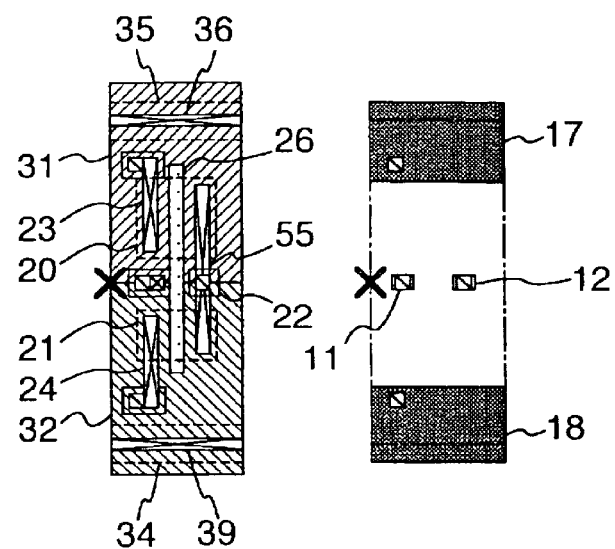
Figure 5C:
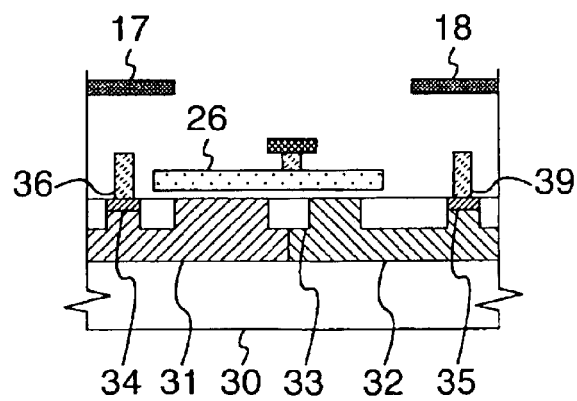
Figure 5D:
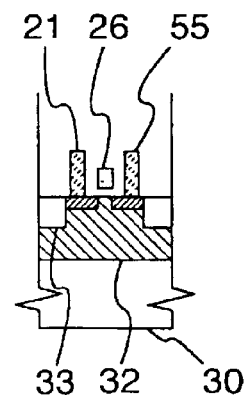

FIGS. 5A–5D illustrate a third embodiment of the present invention. There are presented a circuit diagram of an inverter circuit which is a basic circuit of a CMOS integrated circuit, a layout diagram thereof, and cross sectional views thereof. FIG. 5C is a cross sectional view obtained by cutting a central portion in the layout diagram in an Y direction. FIG. 5D is a cross sectional view obtained by cutting a portion of an NMOS transistor in the layout diagram in an X direction.

The present embodiment is an embodiment where the drain side is also connected using a long and slim contact hole 55 in the second embodiment of the present invention. The layout presented by the present embodiment can be used in the case where the resistance on the drain side exerts the great influences on the circuit characteristics, namely, in the case where a non-saturation region of the MOS transistor is used.

Also, in the present embodiment, almost all the surfaces of the diffusion layers are covered with the metals inside the contact holes. This condition lowers the resistances of all the diffusion layers. Consequently, in this case, it becomes unnecessary to lower the sheet resistance of the diffusion layer by covering the diffusion layer with a silicide such as $TiSi_2$ or $CoSi_2$ that is a compound of silicon and a metal the resistance of which is lower than that of silicon. Namely, there occurs no need of silicidizing the diffusion layer, so that this results in a technical effect of being capable of simplifying the fabricating process.

Figure 6A:
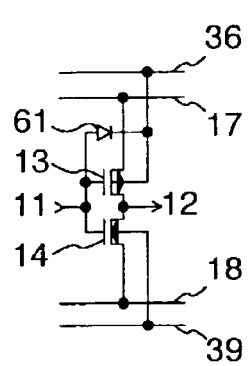
FIGS. 6A–6D are configuration diagrams of a fourth embodiment in the present invention.
Figure 6B:
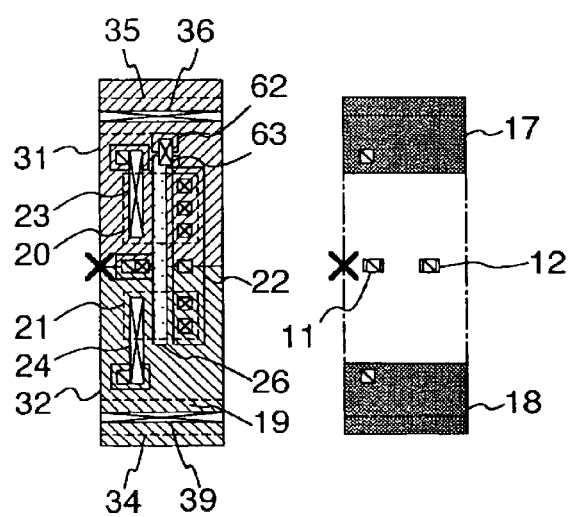
Figure 6C:
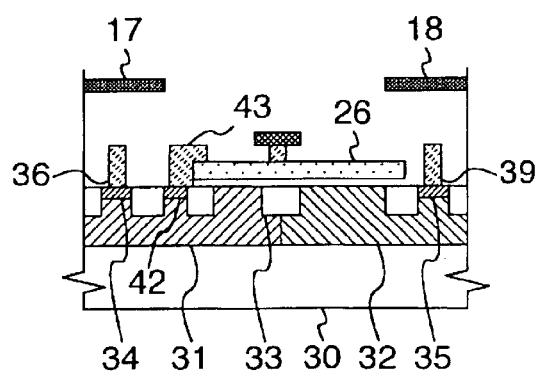
Figure 6D:
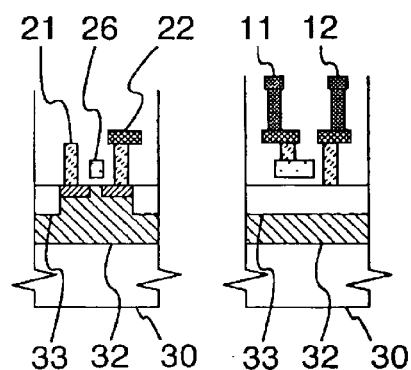

FIGS. 6A–6D illustrate a fourth embodiment of the present invention. There are presented a circuit diagram of an inverter circuit which is a basic circuit of a CMOS integrated circuit, a layout diagram thereof, and cross sectional views thereof. FIG. 6C is a cross sectional view obtained by cutting a central portion in the layout diagram in an Y direction. FIG. 6D is a cross sectional view obtained by cutting a portion of an NMOS transistor in the layout diagram in an X direction.

The embodiment illustrated in FIGS. 6A–6D is an embodiment where the gate electrode is further connected to a diode 61 in parallel to each other in the second embodiment of the present invention. In the diode 61, a line is exposed to plasma when the line is etched and processed. This condition causes the gate electrode to be exposed to a high electric field, thus breaking down the gate oxide film. The diode 61 is inserted in order to prevent this phenomenon. In the present embodiment, the diode 61 is formed between a diffusion layer 42 and the N-well. A conductor layer 43 embedded into a long contact hole is used in order to connect the diode 61 to the gate electrode 26. This procedure makes it possible to connect the gate to the diffusion layer with a low resistance and to locate the diode in adjacent with the gate electrode. This results in a technical effect of being capable of decreasing an area necessary for locating the diode.

Figure 7A:
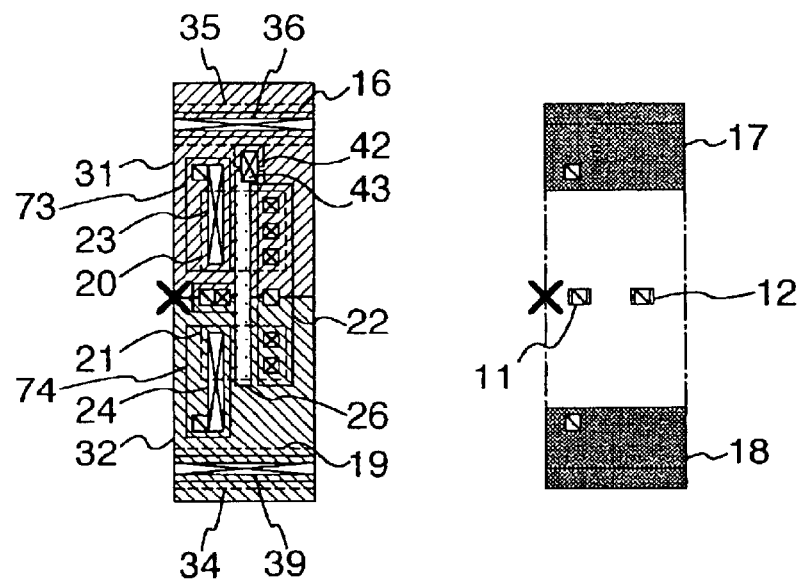
FIGS. 7A–7C are configuration diagrams of a fifth embodiment in the present invention.
Figure 7B:
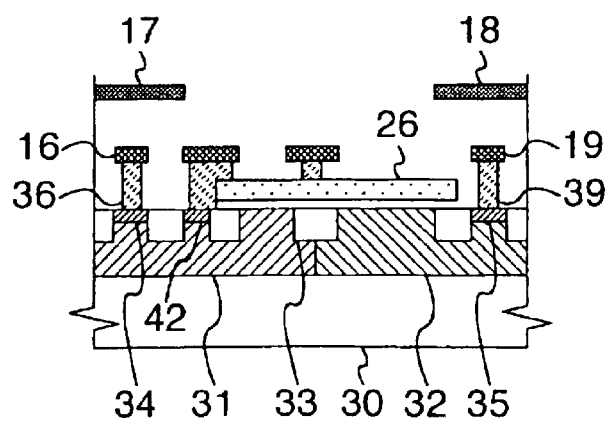
Figure 7C:
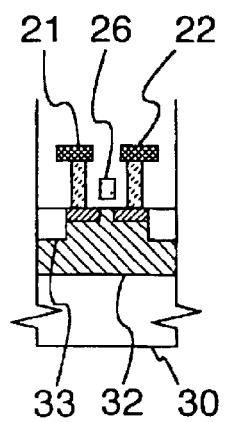

FIGS. 7A–7C illustrate a fifth embodiment of the present invention. There are presented a circuit diagram of an inverter circuit which is a basic circuit of a CMOS integrated circuit, a layout diagram thereof, and cross sectional views thereof. FIG. 7B is a cross sectional view obtained by cutting a central portion in the layout diagram in an Y direction. FIG. 7C is a cross sectional view obtained by cutting a portion of an NMOS transistor in the layout diagram in an X direction.

The embodiment illustrated in FIGS. 7A–7C is an embodiment where, in the fifth embodiment in the present invention, the first-layer metal layer is located on the well contact and the upper portion of the diode so as to overlap with the source side of the transistors. In this case, as there originally exist the long and slim contact hole, there occurs no variation in the technical effect of being capable of lowering the resistances of the respective portions. However, there occurs a slight increase in the parasitic capacitance and there occurs need of a wider area. In the case of the present embodiment, there exists a technical effect of making it easier to etch the first-layer metal layer.

Figure 8A:
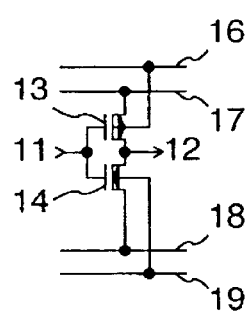
FIGS. 8A–8C are configuration diagrams of a sixth embodiment in the present invention.
Figure 8B:
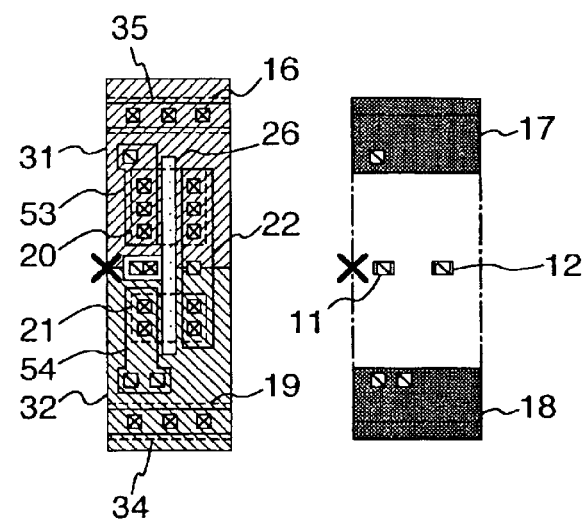
Figure 8C:
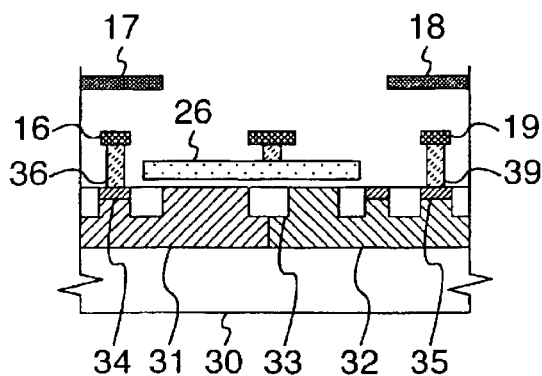

FIGS. 8A–8C illustrate a sixth embodiment of the present invention. There are presented a circuit diagram of an inverter circuit which is a basic circuit of a CMOS integrated circuit, a layout diagram thereof, and cross sectional views thereof.

The present embodiment is an embodiment where the longitudinally long or the transversely long contact holes are not employed unlike the first embodiment of the present invention.

In the present embodiment, the longitudinally long or the transversely long contact holes are not employed as well as the second to fifth embodiments, so that there exists none of the technical effect that the metal embedded into the contact hole makes it possible to reduce the resistance. However, as is the case with the first embodiment of the present invention, a power line 17 and a ground line 18 are located on the lines 16 and 19 for providing the well potentials. This procedure brings about the technical effect of not increasing the area even in the CMOS integrated circuit device which allows the low-power and high-speed operation to be implemented through the control of the well potentials.

Figure 9A:
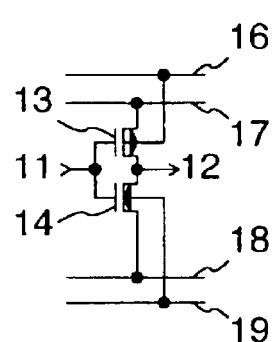
FIGS. 9A–9C are configuration diagrams of a seventh embodiment in the present invention.
Figure 9B:
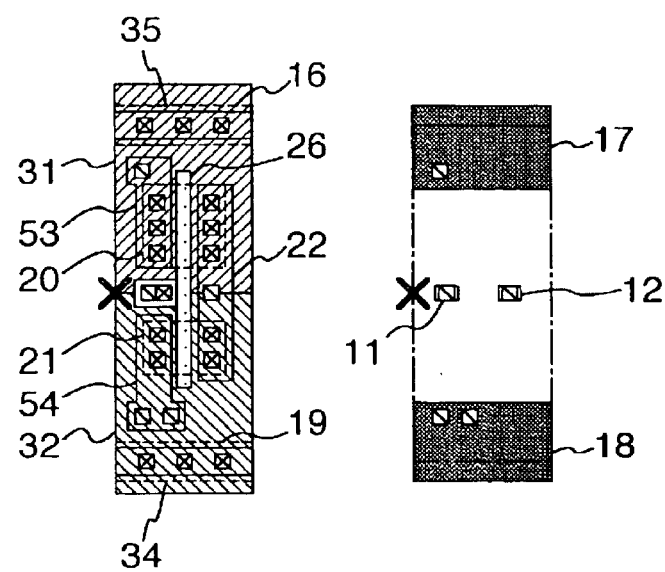
Figure 9C:
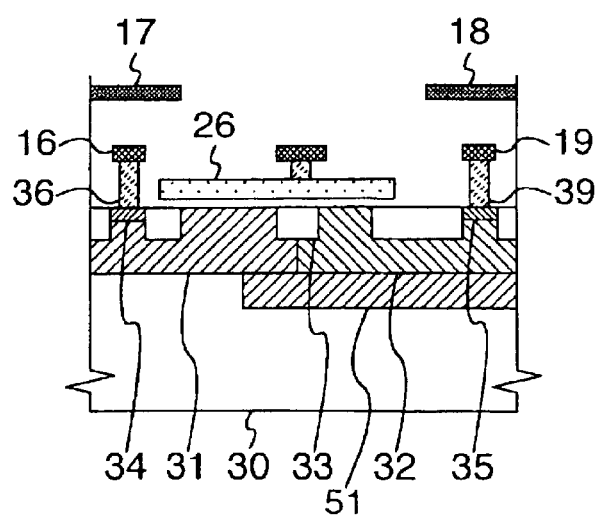

FIGS. 9A–9C illustrate a seventh embodiment of the present invention. The present embodiment is one where the present invention is applied to a triple well structure. In the present drawings, reference numeral 30 denotes a P-type substrate, 32 a P-well, 31 an N-well, and 51 a deep N-well.

Up to the sixth embodiment of the present invention, there is no deep N-well 51. In such a case, if the substrate is P-type, the substrate is brought into the electrical conduction with the P-well. Consequently, in a system where the potential of the P-well is controlled, it has been required to control the potential of the P-well simultaneously with the potential of the substrate. In the present embodiment, however, the deep N-well isolates the substrate from the P-well electrically. This makes it unnecessary to control the potential of the P-well simultaneously with that of the substrate when the P-well is controlled. Even in the case of the well configuration like this, the present invention is applicable without any problems.

Figure 10A:
FIGS. 10A–10C are configuration diagrams of an eighth embodiment in the present invention.
Figure 10B:
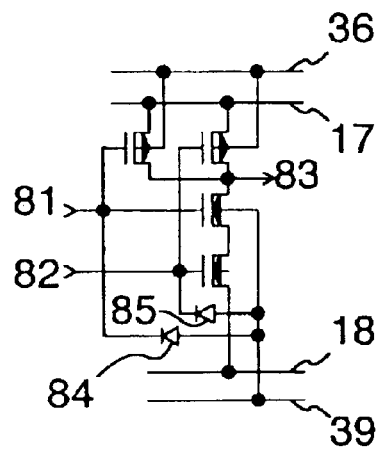
Figure 10C:
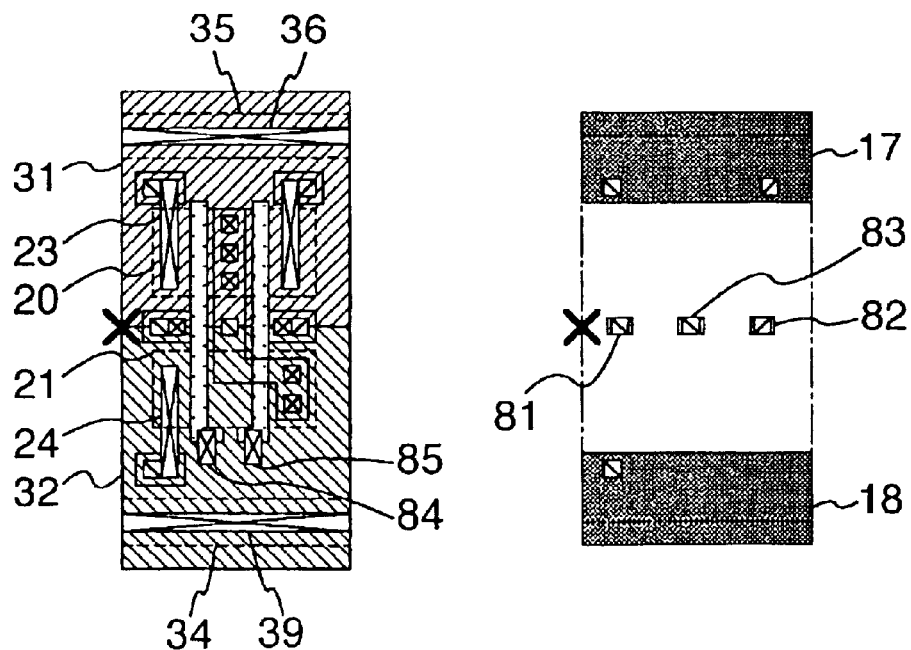

FIGS. 10A–10C illustrate an eighth embodiment of the present invention. The present embodiment is one where the present invention is applied to a triple well structure. In the present drawings, reference numeral 30 denotes a P-type substrate, 32 a P-well, 31 an N-well, and 51 a deep N-well.

Up to the sixth embodiment of the present invention, there is no deep N-well 51. In such a case, if the substrate is P-type, the substrate is brought into the electrical conduction with the P-well. Consequently, in a system where the potential of the P-well is controlled, it has been required to control the potential of the P-well simultaneously with the potential of the substrate. In the present embodiment, however, the deep N-well isolates the substrate from the P-well electrically. This makes it unnecessary to control the potential of the P-well simultaneously with that of the substrate when the P-well is controlled. Even in the case of the well configuration like this, the present invention is applicable without any problems.

Figure 11A:
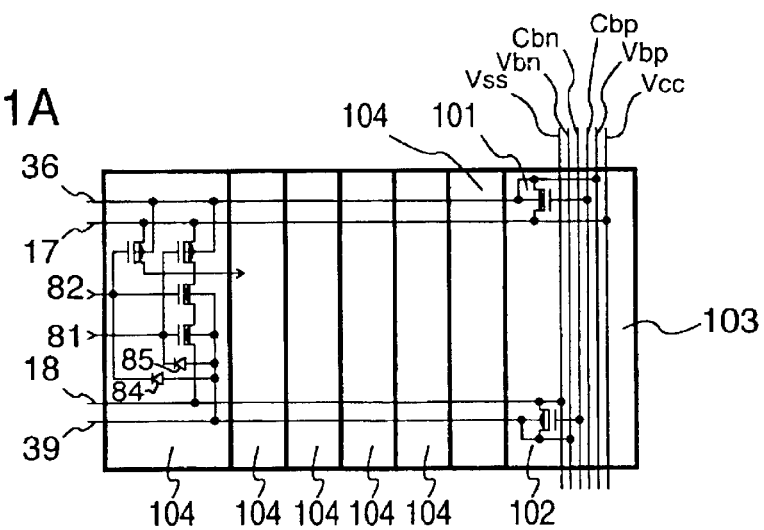
FIGS. 11A–11D are location diagrams concerning a cell and a switching cell.
Figure 11B:
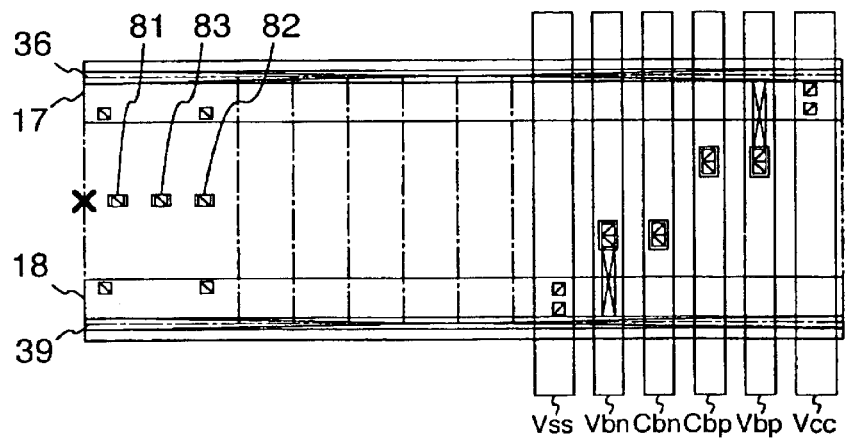
Figure 11D:
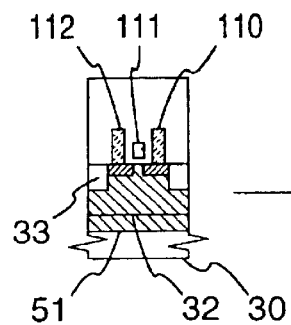
Figure 11C:
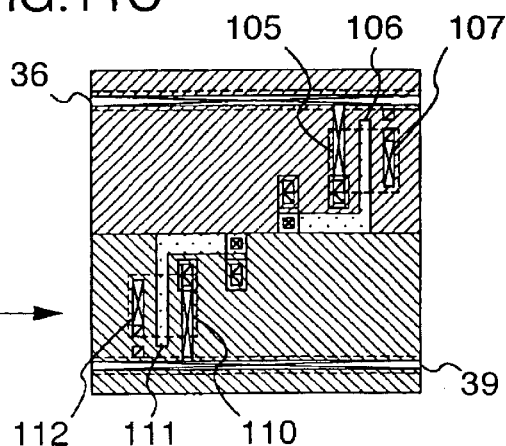

FIG. 11A is a circuit diagram of a cell and a switching cell. FIG. 11B is a layout diagram of a line. FIG. 11C is a layout diagram of a transistor. FIG. 11D is a cross sectional view of the switching cell.

In FIGS. 11A–11D, reference numeral 103 denotes a switching cell, 104 a cell, 101 a PMOS switching transistor, and 102 an NMOS switching transistor. A signal line Cbn is connected to a gate of the NMOS switching transistor 102, a signal line Vss is connected to a drain thereof, and a signal line Vbn which is a P-well electrode 39 (i.e., a substrate of the NMOS within the cell) is connected to a source thereof. This transistor operates in the following way, for example. Namely, in the operation state where the transistor within the cell is caused to operate, it is desired to make a potential of the P-well equal to the ground potential (i.e., Vss). In this case, the switching MOS 102 is brought into a conduction state by switching a signal line Cbn to "H" level, so that the signal lines Vbn and Vss are short-circuited. Meanwhile, at the time of standby, it is desired to increase the threshold voltage to decrease a leak current. In this case, the signal lines Vbn and Vss are separated from each other by switching the signal line Cbn to "L" level. After that, the signal line Vbn is controlled on the same chip or from the outside so as to be converted into a negative voltage, thereby making it possible to heighten the threshold value.

The relation between the PMOS transistor within the cell and the PMOS switching transistor within the switching cell is also the same, when inverting the relation between the positive and the negative voltages.

In the layout diagram in FIG. 11B, a line 39 for controlling the potential of the P-well and a line 36 for controlling the potential of the N-well are wired by transversely long contact holes, respectively. Moreover, power lines 17 and 18 are formed of the second-layer line layer in such a manner that they overlap with the lines 36 and 39. This procedure and configuration make it possible to form the CMOS integrated circuit based on the system in which the well potentials are controlled without increasing the area.

Also, at this time, the transversely long contact holes are used as the lines 36 and 39, thereby allowing the well contacts to be wired with a low resistance. Also, the lines 17 and 18 which is the lines for power supplies Vcc and Vss within the cell are also formed of a low resistance wiring material such as copper. This procedure prevents the potential drops of the power lines, thereby making it possible to suppress the performance deterioration due to the potential drops.

Incidentally, in the layout diagram in FIG. 11B, the lines extending in the longitudinal direction Vss, Vbn, Cbn, Cbp, Vbp and Vcc are formed of the third-layer line. The third-layer line is also formed of the low resistance wiring material such as copper, thereby permitting the high performance to be anticipated.

Also, as is the case with the present embodiment, concerning the switching cell as well, it is also possible to implement the configuration in which the resistances of the source and drain are made lower with the use of longitudinally long contact holes 110 and 112.

Figure 12A:
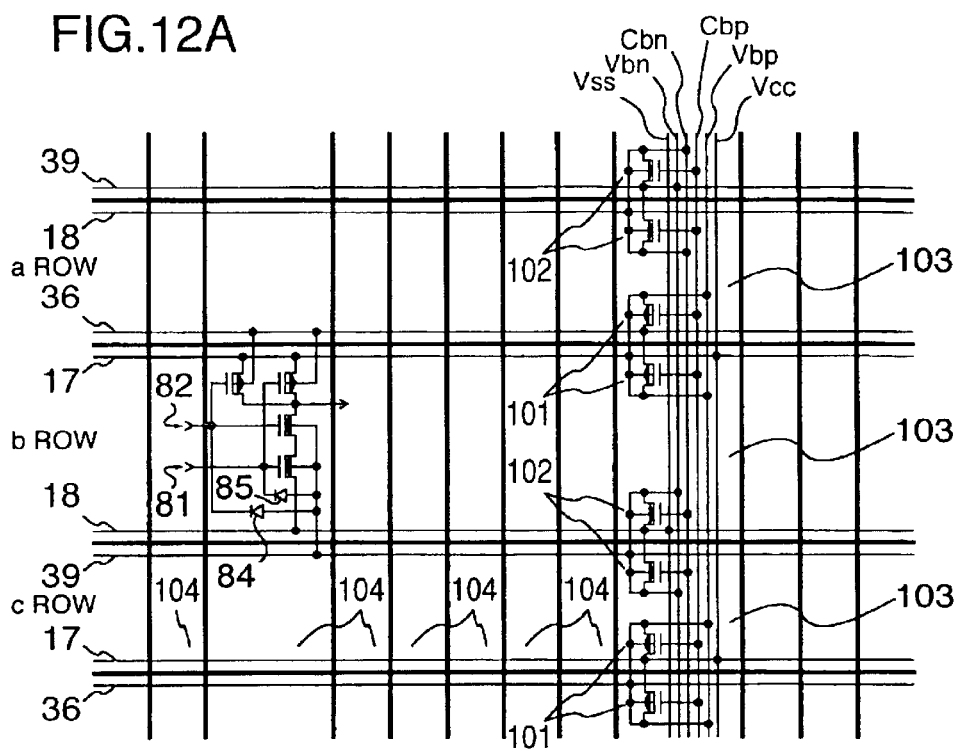
FIGS. 12A and 12B are location diagrams concerning a cell and a switching cell.
Figure 12B:
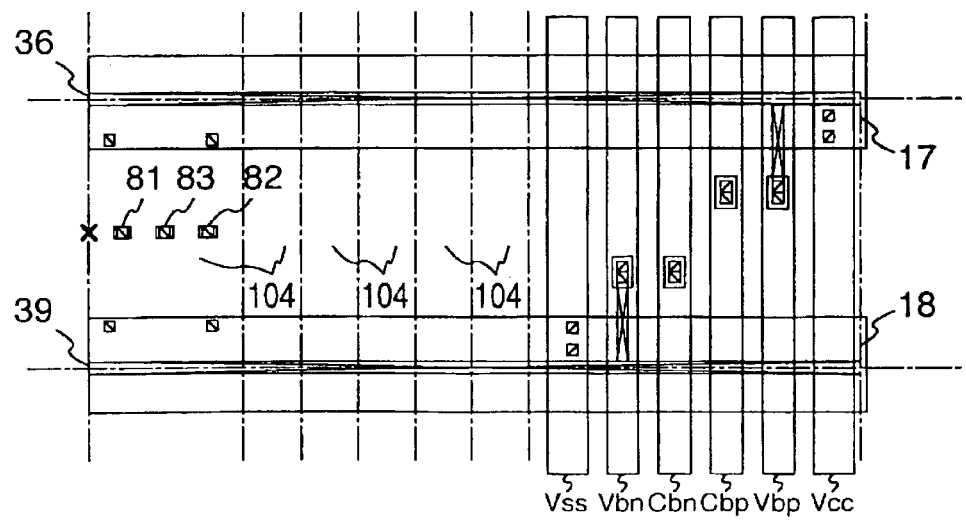

FIGS. 12A and 12B illustrate the circuit diagram and the layout diagram in the case where the cells and the switching cells are arranged in the X direction and the Y direction.

In the drawings, there are presented the rows which are referred to as "a row", "b row" and "c row" from the above. In the present embodiment, concerning the "a row" and the "b row", a linearly symmetrical relation is established between the location of the power supply and the locations of the wells. Namely, in the "b row", the P-well is located in a lower position and the N-well is located in an upper position. Conversely, in the "a row", the P-well is located in an upper position and the N-well is located in a lower position. This location makes it possible to use the power line Vcc 17 and the line 36 for the N-well in common to the "a row" and the "b row". Also, the relation between the "b row" and the "c row" is the same as the relation between the "a row" and the "b row". At this case, the ground line Vss 18 and the line 39 for the P-well can be used in common. These locations make it possible to decrease the area. Also, the use of the transversely long contact holes permits the resistances of the well lines to be lowered. Moreover, it is possible to use the respective power lines in common to the upper row and the lower row thereof, thereby permitting the respective power lines to be made heavier. Accordingly, as compared with the prior art, the spacing between the switching cells can be made smaller. This ultimately results in a technical effect of being capable of decreasing the area of the chip.

Figure 13A:
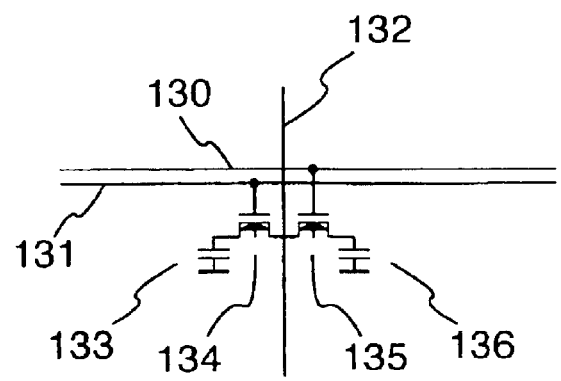
FIGS. 13A and 13B are circuit diagrams of a DRAM cell and a cross sectional view thereof.
Figure 13B:
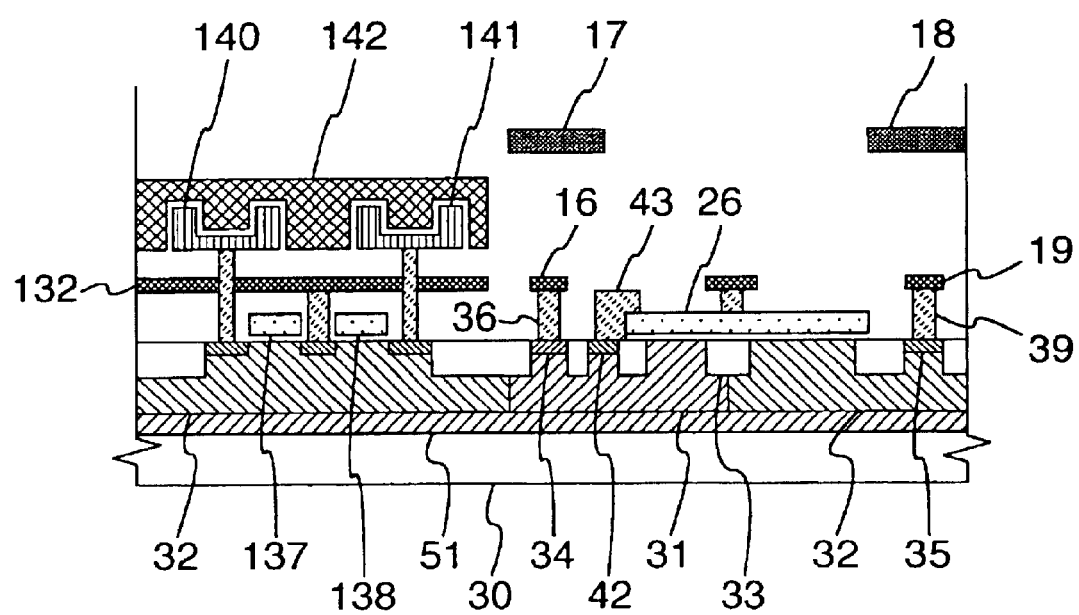

FIGS. 13A and 13B illustrate a circuit diagram of DRAM cells and a cross sectional view in which the DRAM cells are combined with the circuits illustrated in FIGS. 1A–1D and so on.

In the present embodiment, the circuit diagram of the DRAM cells corresponds to the case of 2 bits. In the drawing, reference numerals 130 and 131 denote word lines, 132 a bit line, 134 and 135 NMOS transistors, and 133 and 136 capacitors. The transistor 134 and the capacitor 133 constitute one memory cell, and the transistor 135 and the capacitor 136 constitute another memory cell.

Also, in the cross sectional view, reference numerals 137 and 138 denote word lines which become gate electrodes, 140 and 141 polysilicon electrodes, and 139 a plate electrode. Also, the right half of the cross sectional view indicates the logical circuit unit which are explained up to now.

In the cross sectional view, the word line 137 corresponds to the word line 131, and a dielectric film between the polysilicon electrode 140 and a plate electrode 142 forms the capacitor 133. Similarly, the word line 138 corresponds to the word line 130, and a dielectric film between the polysilicon electrode 141 and a plate electrode 142 forms the capacitor 136. Also, the first-layer metal line layer forms the bit line 132.

In the DRAM cell, it is necessary to make larger the value of a ratio between a capacitance Cs within the cell and a capacitance Cb of the bit line. This requires that the capacitance of the bit line should be small. This further requires that the bit line of the DRAM cell should be made thin.

As seen in the prior art, in the system in which the connection of the transistors is established using the first-layer metal line, making the first-layer metal line thinner gives rise to an increase in the resistance within the logical circuit. This has resulted in a problem of lowering the performance of the logical circuit. In the present invention, however, the metal layers embedded into the transversely or longitudinally long contact holes are used. On account of this, no problem occurs even if the resistance of the first-layer metal layer is increased. Accordingly, as is indicated in the present embodiment, even if the first-layer metal line layer thus made thinner is used as the bit line of the DRAM cell, there occurs none of the lowering in the performance of the logical circuit. Also, considering the problem of the material side, there occurs none of the deterioration in the performance of the logical circuit even if a material such as tungsten is employed. Here, the tungsten is a high melting point metal which is easy to process and thus is suitable for the bit line of the DRAM cell, but has a high resistance.

Meanwhile, in the present embodiment, the second-layer metal line layers 17 and 18 are located on the capacitor in the DRAM cell. This configuration makes it possible to use a low resistance line such as the copper line which is suited to perform the processing with the use of the planarizing technique by the CMP method.

Figure 14:
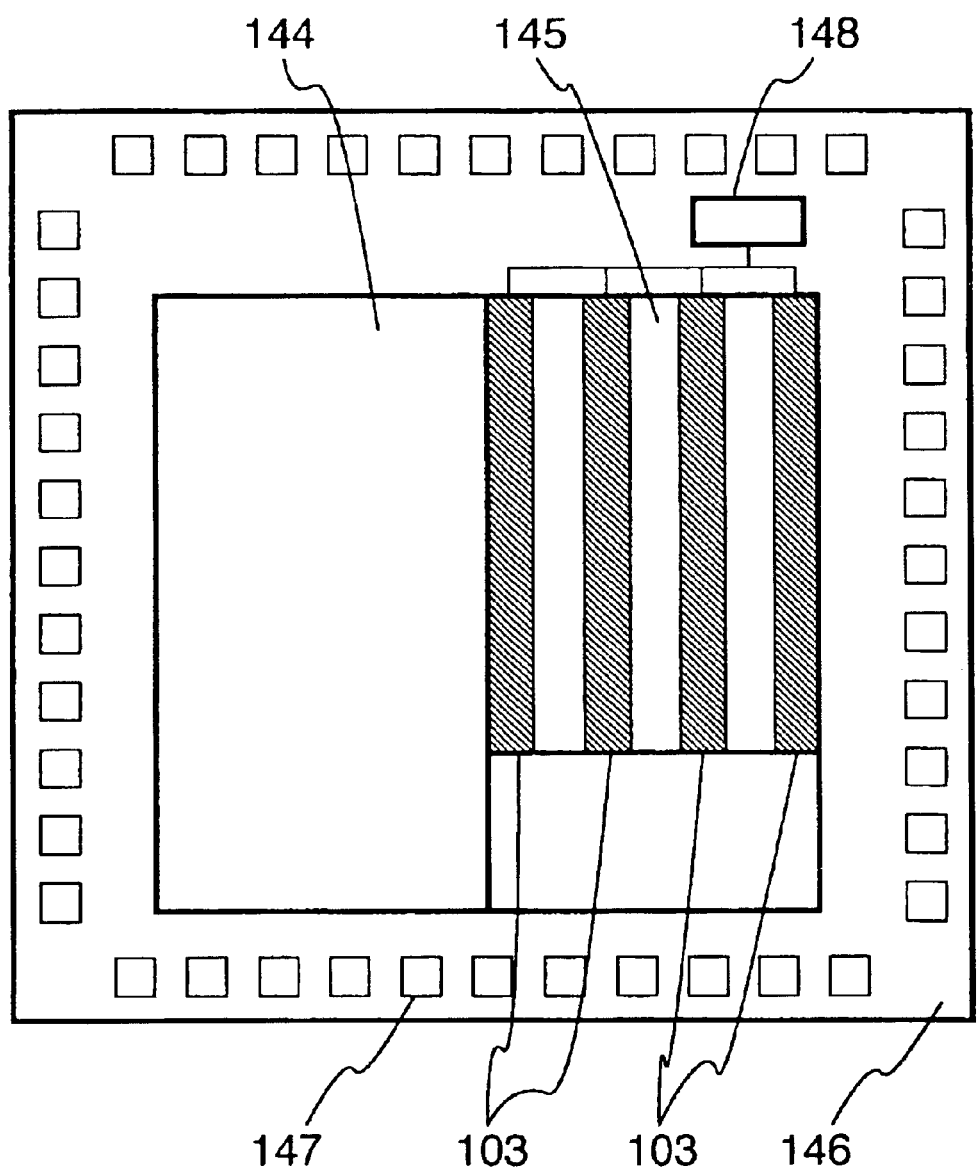
FIG. 14 is a layout diagram of a chip.

FIG. 14 is a layout diagram of a semiconductor integrated circuit chip onto which the present invention is applied. In FIG. 14, reference numeral 146 denotes an input/output interface region, 144 a DRAM array region, 145 the logical circuit unit, and 148 a substrate bias control unit.

As is indicated in the drawing, the present invention is also applicable to the case where the DRAM and the logical circuit are integrated simultaneously on an identical chip. As illustrated in the drawing, in the logical circuit unit, switching cells 103 are arranged with a certain fixed spacing provided there-between. As is indicated in FIGS. 12A and 12B, the spacing between the switching cells can be made smaller. This eventually brings about an technical effect of being capable of making the chip area smaller.

As having been explained in the embodiments up to now, the present invention results in the technical effect of achieving the high performance without increasing the number of the masks and the area in the integrated circuit having the circuit that controls the substrate bias. Moreover, the present invention is also preferable in the case where the DRAM and the logical circuit are integrated simultaneously on an identical chip.

What is claimed is:

1. A semiconductor integrated circuit device, comprising:
a PMOS transistor formed in a N-type well;
an NMOS transistor formed in a P-type well;
first-layer metal line layers;
second-layer metal line layers;
a plurality of contact holes for connecting said first-layer metal line layers to gate electrodes and diffusion layers of said PMOS and NMOS transistors; and
through holes for connecting said first-layer metal line layers to said second-layer metal line layers, wherein
a potential of said N-type well and a potential of said P-type well are controlled independently of each other;
lines for obtaining the potentials of said N-type and P-type wells includes said first-layer metal line layers, electrical conductors formed inside said contact holes, or said electrical conductors formed inside said contact holes and said first-layer metal line layers; and
said second-layer metal line layers wire a power supply potential and a ground potential;
said electrical conductors formed inside said contact holes and said first-layer metal line layers are formed with tungsten as a main constituent; and
said second-layer metal line layers are formed with copper as a main constituent wherein
a dynamic random access memory is integrated on an identical chip on which said semiconductor integrated circuit device is integrated, said dynamic random access memory using memory cells each of which includes one capacitance element and one transistor; and
bit lines of said dynamic random access memory are formed said first-layer metal line layers.

2. A semiconductor integrated circuit device, comprising:
a PMOS transistor formed in a N-type well;
an NMOS transistor formed in a P-type well;
first-layer metal line layers;
second-layer metal line layers;
a plurality of contact holes for connecting said first-layer metal line layers to gate electrodes and diffusion layers of said PMOS and NMOS transistors; and
through holes for connecting said first-layer metal line layers to said second-layer metal line layers, wherein
a potential of said N-type well and a potential of said P-type well are controlled independently of each other;
lines for obtaining the potentials of said N-type and P-type wells includes said first-layer metal line layers, electrical conductors formed inside said contact holes, or said electrical conductors formed inside said contact holes and said first-layer metal line layers; and
said second-layer metal line layers wire a power supply potential and a ground potential;

said electrical conductors formed inside said contact holes and said first-layer metal line layers are formed with tungsten as a main constituent; and said second-layer metal line layers are formed with copper as a main constituent wherein a dynamic random access memory is integrated on an identical chip on which said semiconductor integrated circuit device is integrated, said dynamic random access memory using memory cells each of which includes one capacitance element and one transistor; and bit lines of said dynamic random access memory are formed said first-layer metal line layers, wherein said capacitance element is formed at a height between a height of said first-layer metal line layer and a height of said second-layer metal line layer.

3. A semiconductor integrated circuit device, comprising:
a MIS transistor formed in a substrate;
a memory cell for storing data;
a first metal line layer formed on said substrate; and
a second metal line layer formed on said first metal line layer, wherein
at least a part of a power supply line connected to a source/drain channel in said MIS transistor is constituted by said second metal line layer;
at least a part of a well potential line for controlling a well potential of said MIS transistor is constituted by said first metal line layer; and
at least a part of a bit line for transmitting an input or output data signal to said memory cell is constituted by said first metal line layer.

4. A semiconductor integrated circuit device, comprising:
a MIS transistor formed in a substrate;
a memory cell for storing data;
a first line layer a main constituent of which is tungsten; and
a second line layer a main constituent of which is copper, wherein
at least a part of a power supply line connected to a source/drain channel in said MIS transistor is constituted by said second line layer;
at least a part of a well potential line for controlling a well potential of said MIS transistor is constituted by said first line layer; and
at least a part of a bit line for transmitting an input or output data signal to said memory cell is constituted by said first line layer.

5. A semiconductor integrated circuit device, comprising:
a MIS transistor formed in a substrate;
a memory cell for storing data;
a first metal line layer formed on said substrate, a main constituent of said first metal line layer being tungsten; and
a second metal line layer formed on said first metal line layer, a main constituent of said second metal line being copper, wherein
at least a part of a power supply line connected to a source/drain channel in said MIS transistor is constituted by said second metal line layer; and
at least a part of a bit line for transmitting an input or output data signal to said memory cell is constituted by said first metal line layer.

6. A semiconductor integrated circuit device as claimed in claim 5, wherein at least a part of a well potential line for controlling a well potential of said MIS transistor is constituted by said first metal line layer.

7. A semiconductor integrated circuit device as claimed in claim 5, wherein
said memory cell is a DRAM cell; and
a capacitor of said DRAM cell is located between said first metal line layer and said second metal line layer.

8. A semiconductor integrated circuit device as claimed in claim 5, wherein a gate electrode layer is located between said substrate and said first metal line layer.

9. A semiconductor integrated circuit device as claimed in claim 5, further comprising:
a contact hole for connecting two of said substrate, said first metal line layer, said second metal line layer and said gate electrode layer which are selected as a first connection object and a second connection object, wherein
when an X-Y plane is assumed on a surface of said substrate, projection onto said X-Y plane of a contact surface of said first connection object and said contact hole has a portion at which said projection does not overlap with a mapping onto said X-Y plane of a contact surface of said second connection object and said contact.

10. A semiconductor integrated circuit device as claimed in claim 6, wherein
said memory cell is a DRAM cell; and
a capacitor of said DRAM cell is located between said first metal line layer and said second metal line layer.

11. A semiconductor integrated circuit device as claimed in claim 6, wherein a gate electrode layer is located between said substrate and said first metal line layer.

12. A semiconductor integrated circuit device as claimed in claim 7, wherein a gate electrode layer is located between said substrate and said first metal line layer.

13. A semiconductor integrated circuit device as claimed in claim 6, further comprising:
a contact hole for connecting two of said substrate, said first metal line layer, said second metal line layer and said gate electrode layer which are selected as a first connection object and a second connection object, wherein
when an X-Y plane is assumed on a surface of said substrate, projection onto said X-Y plane of a contact surface of said first connection object and said contact hole has a portion at which said projection does not overlap with a mapping onto said X-Y plane of a contact surface of said second connection object and said contact.

14. A semiconductor integrated circuit device as claimed in claim 7, further comprising:
a contact hole for connecting two of said substrate, said first metal line layer, said second metal line layer and said gate electrode layer which are selected as a first connection object and a second connection object, wherein
when an X-Y plane is assumed on a surface of said substrate, projection onto said X-Y plane of a contact surface of said first connection object and said contact hole has a portion at which said projection does not overlap with a mapping onto said X-Y plane of a contact surface of said second connection object and said contact.

15. A semiconductor integrated circuit device as claimed in claim 8, further comprising:

a contact hole for connecting two of said substrate, said first metal line layer, said second metal line layer and said gate electrode layer which are selected as a first connection object and a second connection object, wherein when an X-Y plane is assumed on a surface of said substate, projection onto said X-Y plane of a contact surface of said first connection object and said contact hole has a portion at which said projection does not overlap with a mapping onto said X-Y plane of a contact surface of said second connection object and said contact.

* * * * *